United States Patent
Cashman

(10) Patent No.: US 9,030,227 B1
(45) Date of Patent: May 12, 2015

(54) METHODS AND APPARATUS FOR PROVIDING REDUNDANCY ON MULTI-CHIP DEVICES

(71) Applicant: Altera Corporation, San Jose, CA (US)

(72) Inventor: David Cashman, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/971,005

(22) Filed: Aug. 20, 2013

(51) Int. Cl.
*H03K 19/003* (2006.01)

(52) U.S. Cl.
CPC ................................ *H03K 19/00392* (2013.01)

(58) Field of Classification Search
None
See application file for complete search history.

(56) References Cited

U.S. PATENT DOCUMENTS

| | | | |
|---|---|---|---|
| 5,777,887 A | 7/1998 | Marple et al. | |
| 6,107,820 A | 8/2000 | Jefferson et al. | |
| 7,134,104 B2 | 11/2006 | Goodnow et al. | |
| 7,362,697 B2 * | 4/2008 | Becker et al. | 370/217 |
| 7,644,327 B2 | 1/2010 | Cohn et al. | |
| 2011/0060888 A1 * | 3/2011 | Keeth et al. | 711/209 |
| 2013/0168672 A1 * | 7/2013 | Lewis | 257/48 |

OTHER PUBLICATIONS

Cashman, U.S. Appl. No. 13/669,244, filed Nov. 5, 2012.

* cited by examiner

*Primary Examiner* — Anh Tran

(57) ABSTRACT

A multi-chip package may include first and second integrated circuit dies that are each partitioned into multiple logic regions. The logic regions of the first and second dies may be coupled via interconnects. Each integrated circuit die may include at least one spare logic region. Multiple logic groups may be formed with each logic group including logic regions from the first and second integrated circuit dies and the interconnects that couple those logic regions. The logic groups may be evaluated to identify defective logic groups. In response to identifying a defective logic group, the defective logic group may be repaired by configuring the first and second integrated circuit dies to stop using the defective logic group and to use a spare logic group. The spare logic group may include spare logic regions of the first and second dies that are coupled by spare logic region interconnects.

19 Claims, 10 Drawing Sheets

METHODS AND APPARATUS FOR PROVIDING REDUNDANCY ON MULTI-CHIP DEVICES

BACKGROUND

Generally, programmable logic devices may be customized by a user (e.g., an engineer or a logic designer) to implement a desired logic design. By incorporating such devices in multi-die packages, programmable logic devices can be integrated with additional dies providing other logical functions.

However, the increased complexity in programmable logic devices may result in manufacturing defects. Such defects may decrease manufacturing yields and affect the functionality of a device as well as device performance. For example, yield loss may occur when assembling multi-die packages as defects may arise in interconnects between dies. Delay penalty associated with the time for inter-die signals to propagate through the device may also have significant impact on device performance.

SUMMARY

An improved signal routing control that provides redundancy for multi-chip packages is provided.

It is appreciated that the embodiments described herein can be implemented in numerous ways, such as a process, an apparatus, a system, a device, or a method on a computer readable medium. Several inventive embodiments of the present invention are described below.

In one aspect, the embodiments described herein provide structures and techniques for configuring a multi-chip package having first and second integrated circuit dies. The first and second integrated circuit dies are partitioned into multiple logic regions. Logic groups are subsequently formed with each logic group including a logic region of the first integrated circuit die and a corresponding logic region of the second integrated circuit die. The logic regions of the logic group are coupled using interconnects on the multi-chip package. The logic groups are then evaluated to identify whether any of the logic groups are defective. In response to identifying a defective logic group, a spare logic group comprising of the spare logic regions of the first and second integrated circuits is configured into use.

In another aspect, the embodiments described herein provide structures and techniques for manufacturing an integrated circuit package. A plurality of logic groups are formed from a first and second logic circuitries. Each logic circuitry includes multiple logic regions and at least one spare region. The plurality of logic groups is evaluated to identify a defective logic group. Upon identifying the defective logic group, the defective logic group is repaired by configuring the integrated circuit package to use a spare logic group instead of the defective logic group.

In another aspect, the embodiments described herein provide structures and techniques for a multi-chip package that includes a first integrated circuit having a first logic region and at least one spare logic region and a second integrated circuit having a second logic region and at least one spare logic region. The package may also include an interconnect that is coupled between the first logic region of the first integrated circuit and the second logic region of the second integrated circuit. The spare regions and an additional interconnect that is coupled between the spare regions of the first and second integrated circuit may be utilized in response to identifying a defect in the first and/or second logic regions.

Further features of the invention, its nature and various advantages, will be more apparent from the accompanying drawings and the following detailed description of the preferred embodiments.

DETAILED DESCRIPTION

It will be appreciated by one skilled in the art that the present exemplary embodiments may be practiced without some or all of these specific details. In other instances, well-known operations have not been described in detail in order not to unnecessarily obscure the present embodiments.

Figure 1:
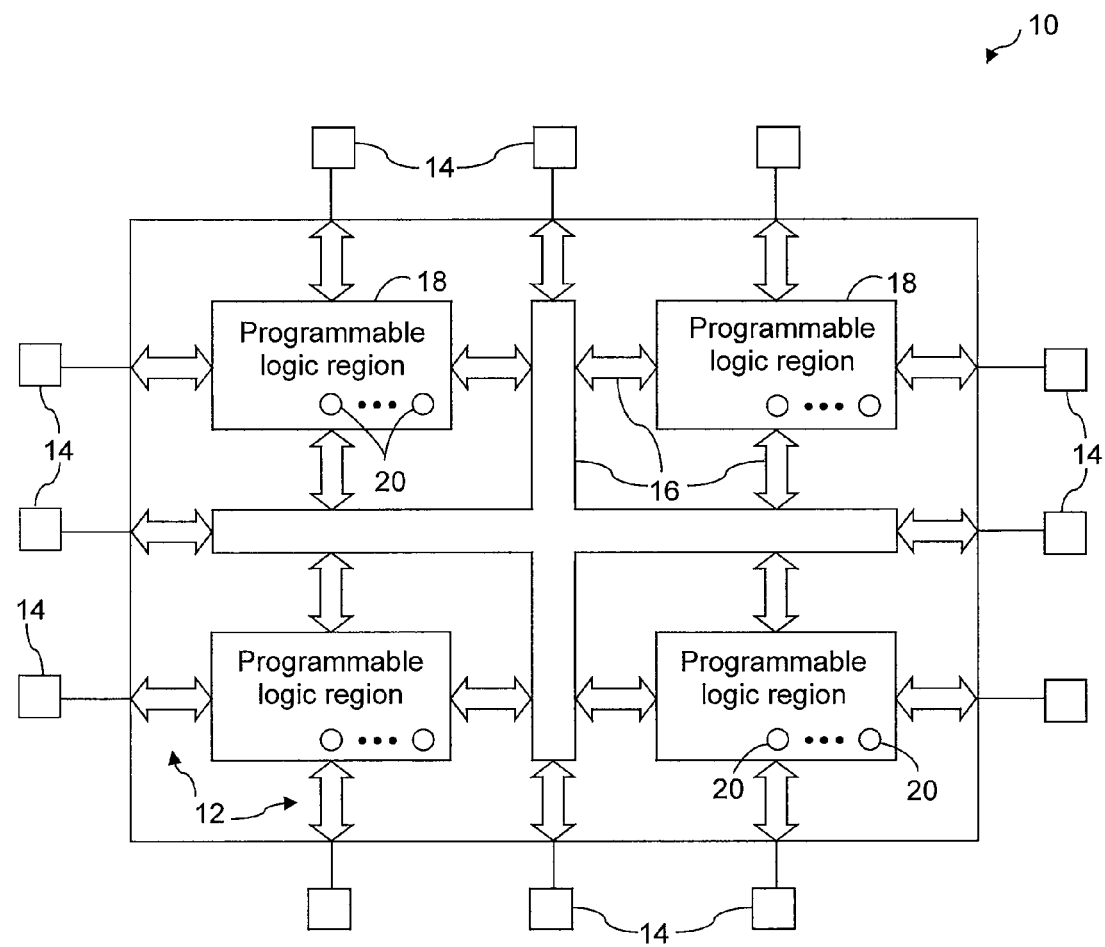
FIG. 1 is a diagram of an illustrative integrated circuit in accordance with an embodiment of the present invention.

FIG. 1 is a diagram of an illustrative integrated circuit 10 in accordance with an embodiment of the present invention. Integrated circuit 10 may have input/output circuitry 12 for driving signals off of integrated circuit 10 and for receiving signals from other circuits or devices via input/output pins 14.

Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of programmable logic device, the memory elements may store configuration data and are therefore sometimes referred to as configuration random-access memory (CRAM) cells. In general, configuration random-access memory elements 20 may be arranged in an array pattern. In a programmable logic device, there may be millions of memory elements 20 on a single device. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

The circuitry of integrated circuit 10 may be organized using any suitable architecture. For example, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

Horizontal and vertical conductors and associated control circuitry may be used to access memory elements 20 when memory elements 20 are arranged in an array. The control circuitry, for example, may be used to clear all or some of the memory elements. The control circuitry may also write data to memory elements 20 and may read data from memory elements 20. Memory elements 20 may be loaded with configuration data, for instance, in CRAM arrays. The loaded configuration data may then be read out from the memory array to confirm proper data capture before integrated circuit 10 is used during normal operation in a system. In general, integrated circuits such as integrated circuit 10 may be tested for defects. If a defect is detected, a redundancy scheme may be provided during manufacturing process to repair the defect using redundant logic regions/rows. For example, a manufacturer may program and load redundancy configuration data into memory elements 20 such that when a defect is detected, redundant logic regions/rows can be switched into use in place of the defective circuitry in the integrated circuit.

Figure 2:
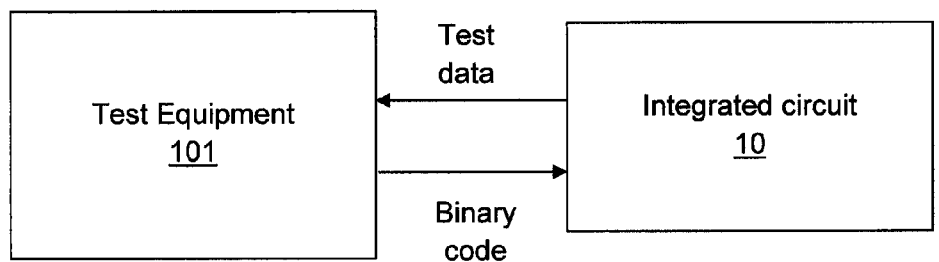
FIG. 2 is a diagram showing a manufacturing system in which integrated circuits can be tested in accordance with one embodiment of the present invention.

FIG. 2 is a diagram showing a manufacturing system in which integrated circuits can be tested in accordance with one embodiment of the present invention. With one suitable arrangement, test equipment 101 may be used during manufacturing. Test equipment 101 may gather test information (e.g., test bench data) from integrated circuit 10. Depending on the received test information, test equipment 101 may send appropriate configuration data (e.g., binary code) to configure integrated circuit 10. In one embodiment, test equipment 101 may configure integrated circuit 10 to use spare logic regions when defective logic regions are detected in the device. In an alternative embodiment, where multiple integrated circuit dies are packaged in a single integrated circuit package, the test equipment 101 may configure one or more of the multiple integrated circuit dies to use spare logic regions when it detects defective interconnects between corresponding logic regions of the multiple integrated.

In certain embodiments multiple integrated circuits such as integrated circuit 10 may be packaged in a single integrated circuit package. For example, two or more integrated circuits may be placed on an interposer in a 2.5-dimensional integrated circuit package. In an alternative example, two or more integrated circuits may be stacked on top of each other in a 3-dimensional (3D) integrated circuit package.

Figure 3:
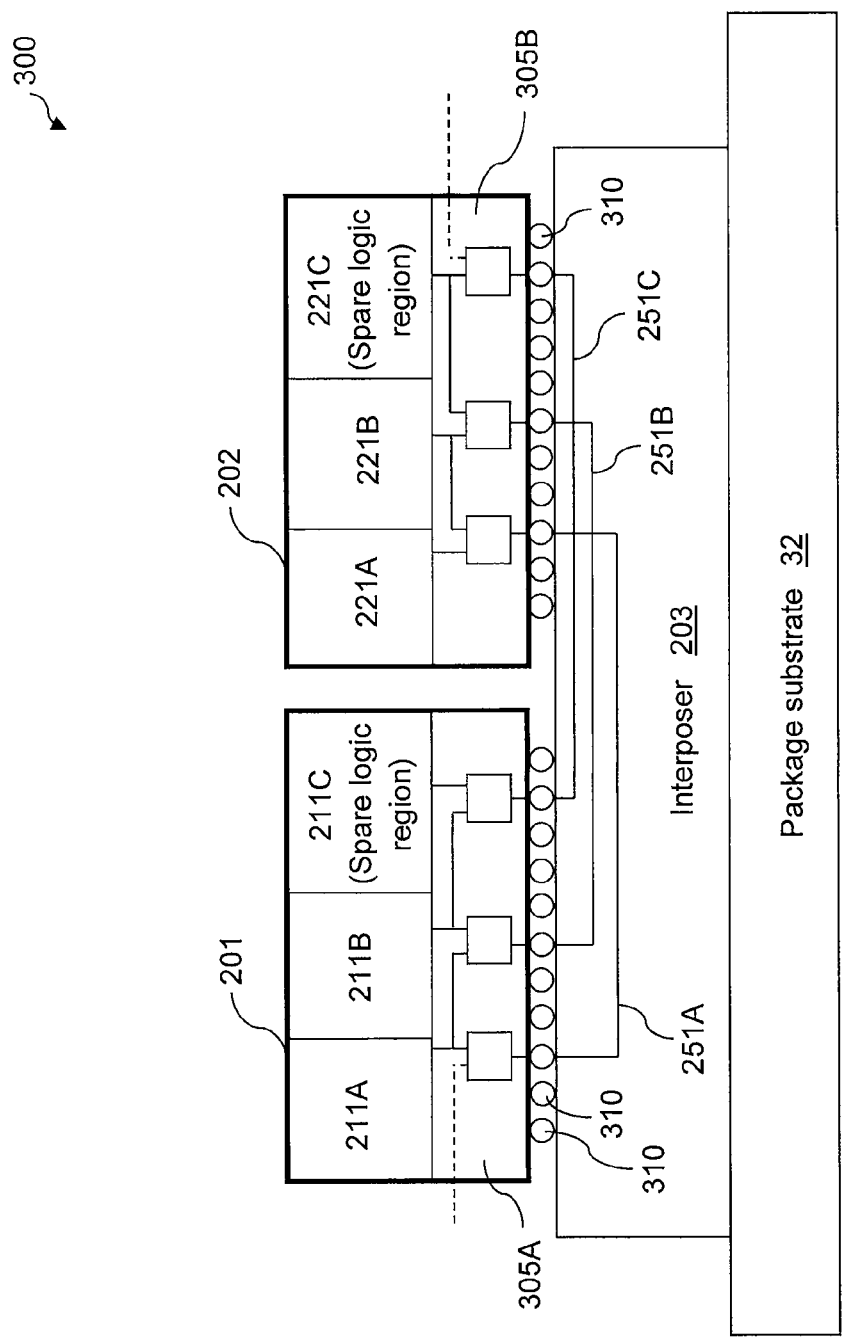
FIG. 3 shows an illustrative 2.5D package in accordance with an embodiment of the present invention.

FIG. 3 shows an illustrative package 300 in accordance with one embodiment. Packaged circuitry such as package 300 that includes interposer 203 may sometimes be referred to as a 2.5-dimensional (2.5D) package. Integrated circuits 201 and 202 may be disposed over package substrate 32. For example, integrated circuits 201 and 202 may be mounted to package substrate 32. Accordingly, interposer 203 may be interposed between package substrate 32 and integrated circuits 201 and 202. Each logic region from integrated circuit 201 may be coupled to a corresponding logic region on integrated circuit 202 via interconnects. For example, logic region 211A may be coupled to logic region 221A via interconnect path 251A, logic region 211B may be coupled to logic region 221B via interconnect 251B, and so on. Each pair of coupled logic regions and corresponding interconnect(s) may collectively referred to as a logic group. When a defective logic group is detected, a spare logic group based on spare logic regions 211C and 221C and spare interconnect 251C may be configured into use to repair the defective logic group.

Integrated circuits 201 and 202 may also include multiplexer blocks 305A and 305B, respectively. Multiplexers in multiplexer blocks 305A-305 may be configured to selectively route signals from a specific logic region on one integrated circuit to a corresponding logic region on another integrated circuit. For example, multiplexers in multiplexer block 305A may select and transmit signals from logic region 211A or another logic region on integrated circuit 201 to a corresponding logic region 221A on integrated circuit 202. In one embodiment, signals may travel both ways between one integrated circuit and another integrated circuit. It should be appreciated that even though a specific number of multiplexers are shown in FIG. 3, fewer or more multiplexers may be used in this context, depending on the required functionality of the integrated circuit package.

Interconnect paths 251A, 251B and 251C may, for example, include traces formed on interposer 203. In one embodiment, interconnect paths 241A, 251B and 251C may form signal pathways for signal transmission between integrated circuit 201 and integrated circuit 202 via microbumps 310.

Figure 4A:
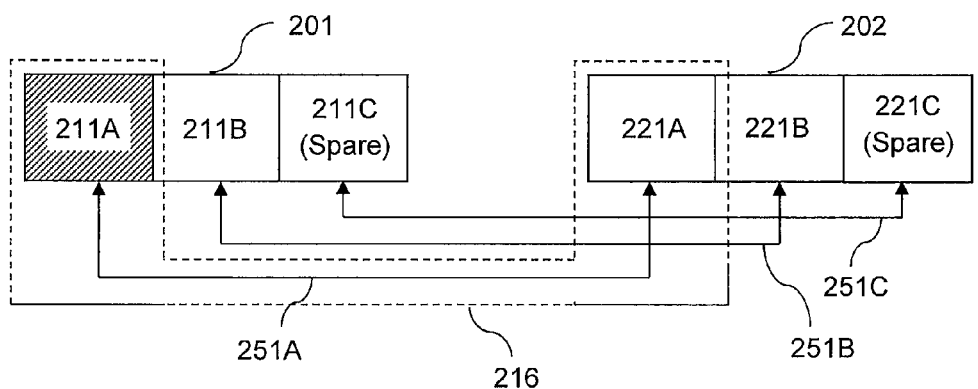
FIG. 4A depicts signal transmission paths between one integrated circuit and another integrated circuit with defective logic region in accordance with one embodiment of the present invention.

FIG. 4A depicts signal transmission paths between integrated circuit 201 and integrated circuit 202 that are part of a multi-chip package, in accordance with one embodiment. It should be appreciated that FIG. 4A shares similarities with FIG. 3 and as such, for the sake of brevity, components already shown in package 300 of FIG. 3 and described above will not be repeated.

Logic region 211A, logic region 221A and interconnect 251A may collectively be referred to as a single logic group (e.g., logic group 216). A logic group includes logic regions from one or more integrated circuits in the multi-chip package, where the logic regions are interconnected using one or more signal transmission paths on the multi-chip package. Such a logic group may be considered as a defective logic group if any one of its component logic regions (e.g., logic regions 211A and 221A) or the interconnect between the component logic regions (e.g., interconnect 251A) is defective. In the example of FIG. 4A, logic group 216 formed by logic regions 211A and 221A, and interconnect 251A is considered a defective logic group because logic region 211A in integrated circuit 201 is a defective logic region (as indicated by the shaded region 211A in FIG. 4A).

In one embodiment, package 300 of FIG. 3 may be configured to use any of the spare logic regions (e.g., spare logic regions 211C and 221C) on integrated circuits 201 and 202 when the logic group is defective. In an example shown in FIG. 4A, if logic group 216 is defective, the logics of logic regions 211A and 221A and corresponding interconnect 251A may shift to adjacent logic regions and interconnect (e.g., logic region 211B, logic region 221B and interconnect 251B). Accordingly, the logics of logic regions 211B and 221C may shift to spare logic regions 211C and 221C. An additional interconnect (e.g., interconnect 251C) that couples spare logic regions 211C and 221C may also be shifted into use to replace interconnect 251B. In one embodiment, the shifting of the spare logic regions may be set by user or programmatically, in response to the defective logic regions.

Figure 4B:
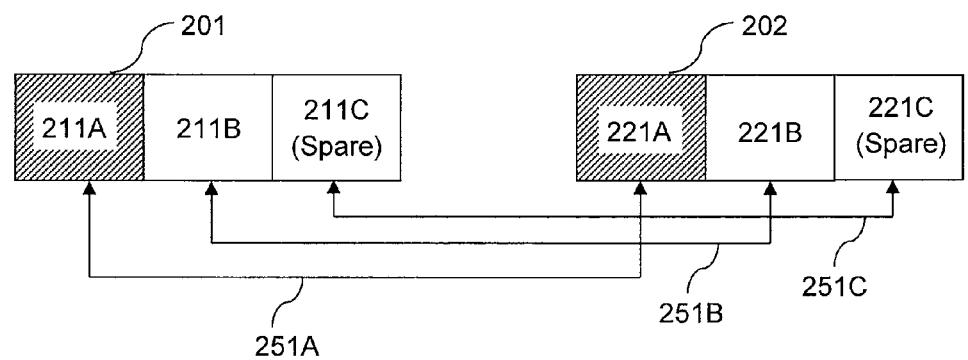
FIG. 4B is a diagram illustrating a defective logic region on a first integrated circuit coupled to another defective logic region on a second integrated circuit in accordance with one embodiment of the present invention.

FIG. 4B is a diagram similar to FIG. 4A showing an illustrative scenario, in which logic regions 211A and 221A are both defective. Referring to FIG. 4A, logic regions 211A and 221A are in a same logic group (e.g., logic group 216). When test equipment 101 of FIG. 2 identifies defects in logic regions 211A and 221A, the logic group that includes logic regions 211A and 221A may be considered as defective. Test equipment 101 may configure integrated circuits 201 and 202 to stop using the defective logic regions and use spare logic regions instead.

Similar to FIG. 4A, the logics of component logic regions (e.g., logic regions 211A and 221A) of the defective logic group may be shifted down to adjacent logic regions (e.g., logic regions 211B and 221B), respectively. Interconnect path 251A that couples between the defective logic regions may also be replaced by interconnect path 251B. Accordingly, the logics of logic regions 211B and 221B may shift down to spare logic regions 211C and 221C, including an additional interconnect path (e.g., interconnect path 251C) that couples between the spare logic regions. In the event that no defects are detected, the logic regions 211A and 221A and interconnect 251A is used normally to route signals.

Figure 4C:
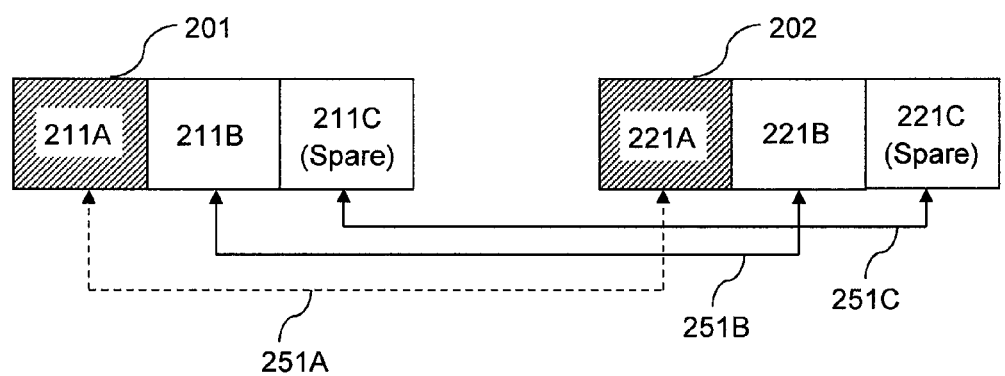
FIG. 4C is a diagram illustrating a defective logic region on a first integrated circuit coupled to another defective logic region on a second integrated circuit through a broken interconnect in accordance with one embodiment of the present invention.

FIG. 4C is a diagram illustrating the resulting multi-chip integrated circuit after the reconfiguration described with reference to FIG. 4B above has been completed, in accordance with one embodiment. In FIG. 4C, the logic group consisting of logic regions 221A and 221A, and interconnect 251A is not being used (indicated by the shaded logic regions 211A and 221A, and the dotted line for interconnect 251A). Instead, the functions performed by this logic group are performed by the logic region consisting of the logic regions 211C and 221C, and interconnect 251C.

During device fabrication, multiple integrated circuits may be tested for defects using binning tools or any suitable sorting tools. Upon identifying the defects, the integrated circuits may be grouped based on the location of defects found in each integrated circuit. The binning tools may select a group of integrated circuits having similar defect location and package them together. For example, integrated circuit 201 and integrated circuit 202 may be selected from a group of integrated circuits with a defective logic regions located in the first row (e.g., logic regions 211A and 221A, respectively). Integrated circuits 201 and 202 with matching defect locations may be packaged together as package 300 of FIG. 3. If desired, an integrated circuit selected from a group of defective integrated circuits may also be packaged together with fully functional (non-defective) integrated circuits.

Following device fabrication, the packaged integrated circuits may undergo post-packaging test. For example, the post-packaging test may verify the integrity of solder connections of the packaged integrated circuits. In the event that defects are detected in one of the integrated circuits, test equipment 101 may program spare logic regions and interconnects into use to repair defective logic regions. For example, the configured spare logic regions (e.g., spare logic regions 211C and 221C) may be switched into use to replace the respective defective logic regions (e.g., logic regions 211A and 221A). In this scenario, an additional interconnect (e.g., interconnect 251C) may be programmatically selected to route signals from spare logic region 211C to spare logic region 221C, as long as there are no other defects found in other logic regions or interconnects that couple the functioning logic regions on integrated circuits 201 and 202.

Figure 4D:
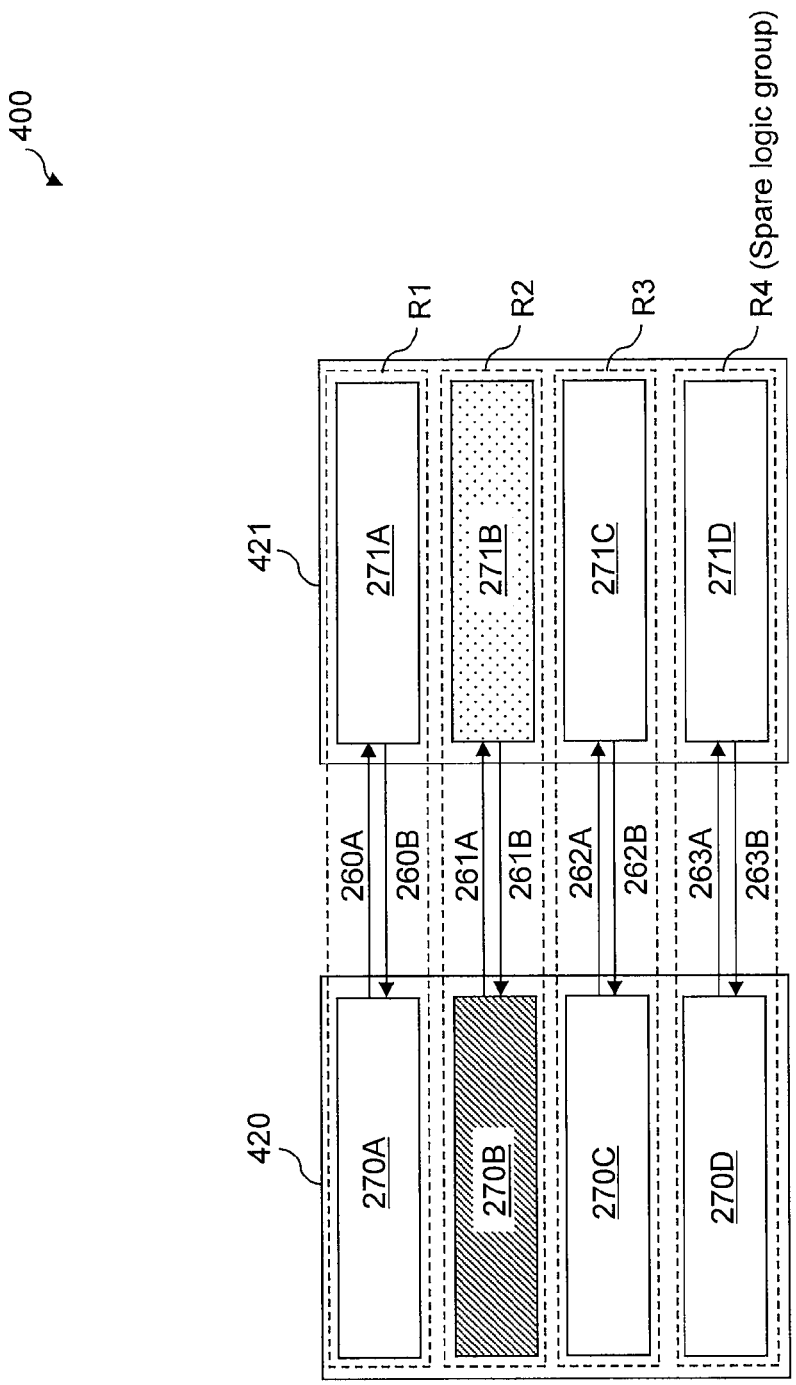
FIG. 4D is a diagram illustrating an integrated circuit having defective logic regions coupled to another integrated circuit in accordance with one embodiment of the present invention.

FIG. 4D is a diagram illustrating device package 400 in which logic regions of two communicating integrated circuits are logically combined to form logical rows. As shown in FIG. 4D, each interconnect and the logic groups or rows that it communicates with in both integrated circuits 420 and 421 may be grouped to form a single larger group or row for the purposes of redundancy. For example, logic region 270A, logic region 271A, and interconnect paths 260A-260B may be grouped to form logic group R1, logic region 270B, logic region 271B, and interconnect paths 261A-21B may be grouped to form logic group R2, logic region 270C, logic region 271C, and interconnect paths 262A-262B may be grouped to form logic group R3, logic region 270D, logic region 271D, and interconnect paths 263A-263B may be grouped to form logic group R4, and so on. Logic group R4 may sometimes be referred to as spare logic group or redundant circuitry or redundant logic regions, because spare logic group R4 provides redundant functionality to logic groups such as R1, R2 and R3. It should be appreciated that even though spare logic group R4 is shown in embodiment of FIG. 4D, other logic groups of FIG. 4D may be used as spare logic groups as well.

When a defect is detected in any logic group within an integrated circuit package, all logic groups starting from the defective logic group may be shifted down such that the functions originally performed by each group are shifted to a subsequent group. For example, logic region 271B (indicated by dotted region 271B) and interconnect paths 261A-261B may not be used when corresponding logic region 270B is defective (indicated by shaded region 270B). In this scenario, logic group R2 may be treated as broken. To repair this defect, all logic functions from the defective logic group R2 may shift to logic group R3 and logic functions from logic group R3 may shift to spare logic group R4 so that defective logic group R2 is not used.

Figure 5:
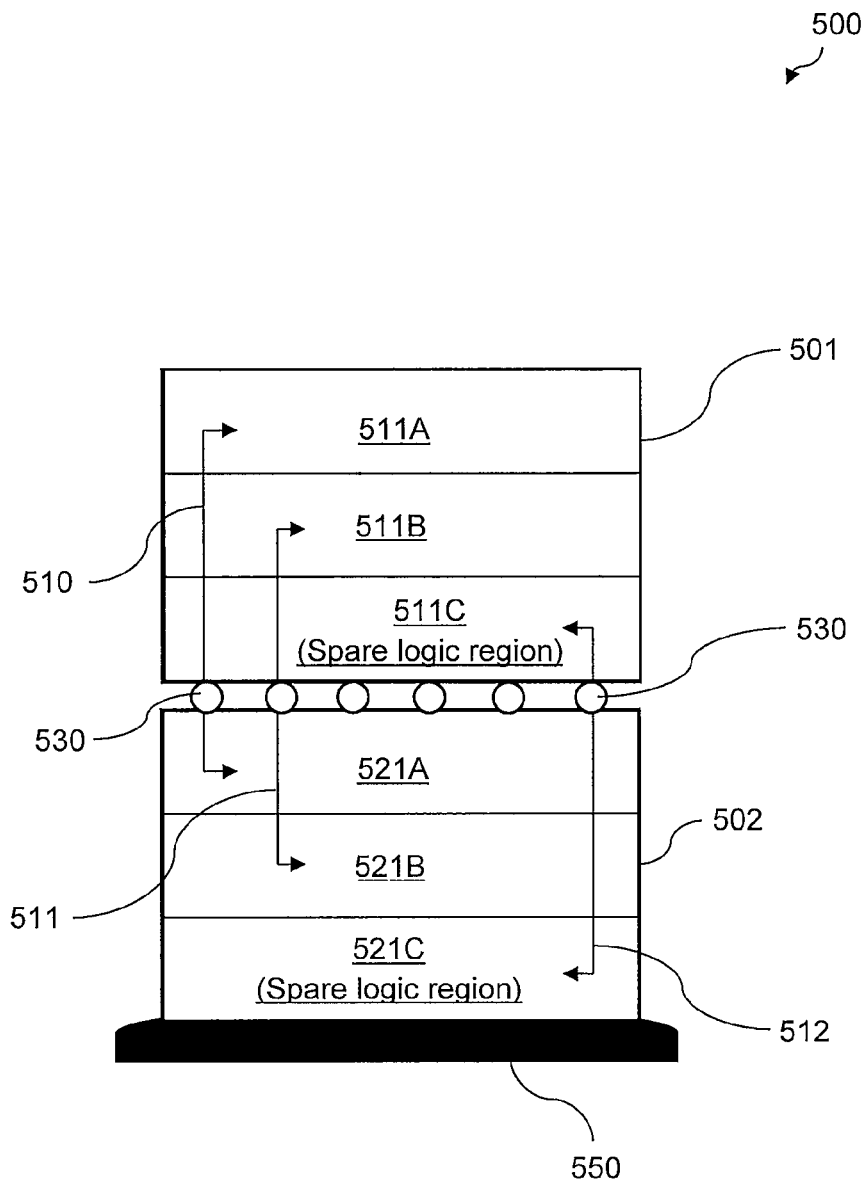
FIG. 5 shows an illustrative three-dimensional (3D) multi-chip package in accordance with an embodiment of the present invention.

Integrated circuits may be stacked to form a three-dimensional (3D) package. FIG. 5 shows an illustrative 3D package 500 in accordance with an embodiment of the present invention. Package 500 includes integrated circuit 501 stacked on integrated circuit 502. As shown in FIG. 5, integrated circuit 502 may be disposed over package substrate 550 (e.g., integrated circuit 502 may be mounted on package substrate 550). It should be appreciated that even though two integrated circuits (e.g., integrated circuits 501 and 502) are shown in the embodiment of FIG. 5, depending on the required functionality of the integrated circuit package, two or more integrated circuits may be included in an integrated circuit package such as 3D package 500.

Signals may travel from one logic region on one integrated circuit to a corresponding logic region on another integrated circuit via microbumps 503. Interconnect paths such as interconnect paths 510, 511 and 512 may be programmed to couple logic regions on integrated circuit 501 to corresponding logic regions on integrated circuit 502. For example, interconnect path 510 may couple logic region 511A to logic region 521A, interconnect path 511 may couple logic region 511B to logic region 521B, interconnect path 512 may couple logic region 511C to logic region 521C and so on. Each set of coupled logic regions and corresponding interconnects may be collectively referred to as a single logic group.

A logic group may be considered as defective when any one of the logic regions in the logic group or one of the interconnects coupling the logic regions in the logic group is defective. In the event a defective logic group exists in an integrated circuit package such as 3D package 500, spare logic regions 511C and 521C and interconnect 512 (or collectively known as a spare logic group) may be used when logic functions are shifted from the defective logic group to the spare logic group.

Figure 6:
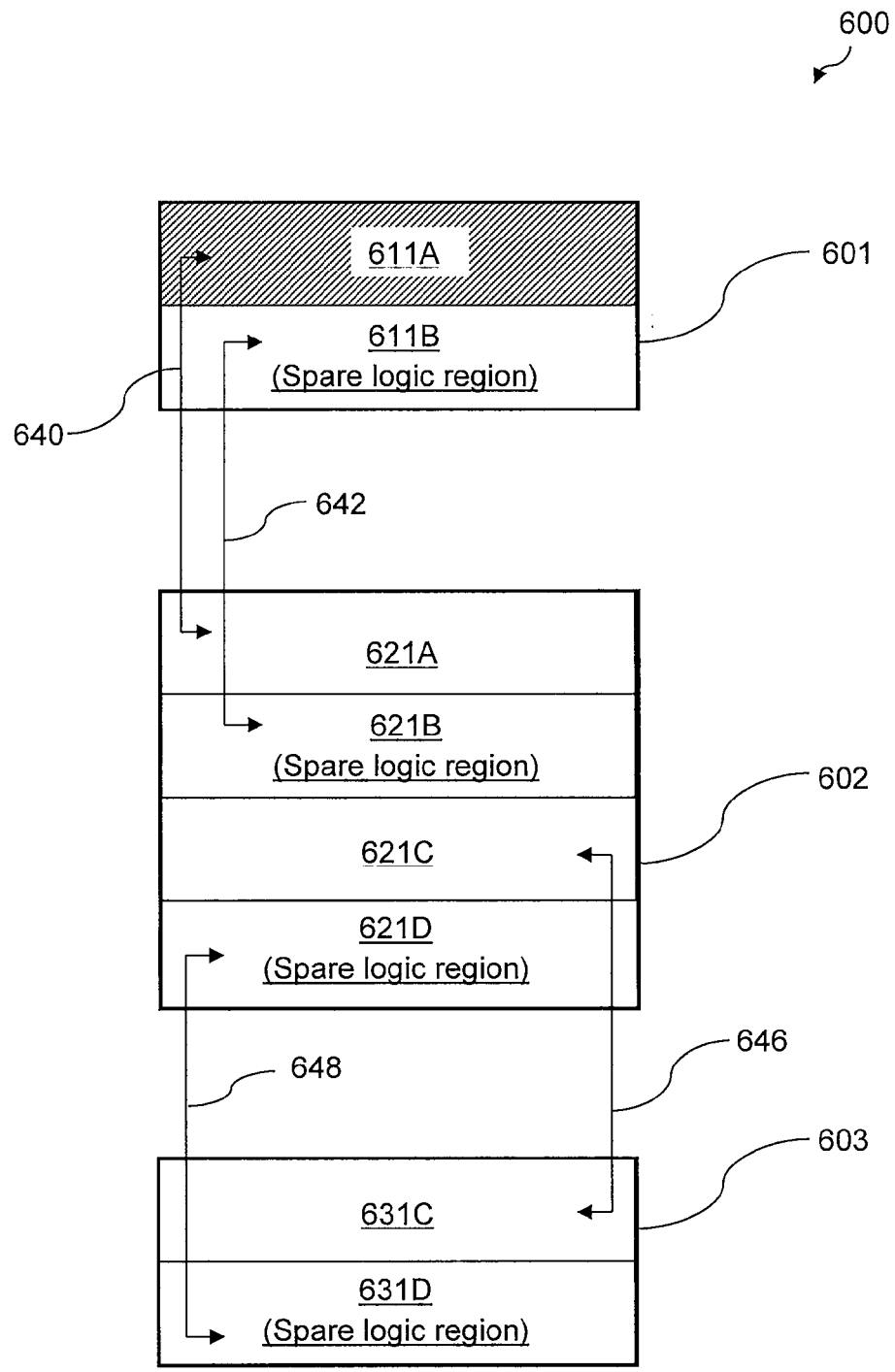
FIG. 6 is a diagram illustrating a three-dimensional (3D) multi-chip package with an integrated circuit having multiple spare logic regions in accordance with an embodiment of the present invention.

FIG. 6 is a diagram illustrating a three-dimensional (3D) multi-chip package 600 with an integrated circuit having multiple spare logic regions in accordance with an embodiment of the present invention. In one embodiment, two or more integrated circuits may be stacked vertically or horizontally connecting to an interposer in a package. For example, integrated circuits 601-603 may be stacked over each other to form a 3D integrated circuit package (e.g., multi-chip package 600). In another example, integrated circuits 601-603 may also be placed horizontally on an interposer (e.g., interposer 203 of FIG. 3) to form a 2.5-dimensional integrated circuit package.

Spare logic region 611B and corresponding spare logic region 621B and interconnect path 642 may be shifted into use when defective logic regions are detected in the multi-chip package. As shown in FIG. 6, logic region 611A may be identified as defective by test equipment 101 of FIG. 2. Accordingly, corresponding logic region 621A and interconnect path 640 may also be treated as defective. In this scenario, spare logic regions in both integrated circuits (e.g., spare logic regions 611B and 621B of integrated circuits 601 and 602, respectively) may be configured to perform the desired logic functions of logic regions 611A and 621A. An additional interconnect path (e.g., interconnect path 642) that couples the spare logic regions may also be used to support this configuration. In another example, if logic region 631C of integrated circuit 603 is identified as defective, corresponding logic region 621C of integrated circuit 602 and interconnect path 646 are treated as defective. In this scenario, spare logic regions (e.g., spare logic regions 621D and 631D) of integrated circuit 602 and integrated circuit 603 may be configured to replace the defective logic region by shifting the logics from the defective logic regions (e.g., defective logic regions 621C and 631C) down to spare logic regions 621D and 631D. Additionally, spare interconnect path 648 may be configured into use to replace interconnect path 646 that couples between logic region 621C and defective logic region 631C.

For multi-chip packages with more than two integrated circuits, the redundancy scheme may be invoked to shift spare logic regions from adjacent integrated circuits. As shown in FIG. 6, multi-chip package 600 may have three integrated circuits (e.g., integrated circuit 601, integrated circuit 602, and integrated circuit 603). Integrated circuit 601 may be placed adjacent to integrated circuit 602 and integrated circuit 603 may be placed adjacent to integrated circuit 602. In this arrangement, spare (redundant) logic regions of integrated circuit 601 and integrated circuit 603 are decoupled from each other (e.g., there is no interconnect that connects spare logic regions of integrated circuits 601 and 603). In this scenario, integrated circuit 602 that couples between integrated circuit 601 and 603 may require to have at least two spare logic regions (e.g., spare logic regions 621B and 621D). Each spare logic region and all of the logic regions adjacent to the spare logic region (but not including the next spare logic region) in integrated circuit 602 may be coupled to a spare logic region (e.g., spare logic regions 621B coupled to spare logic region 611B) of integrated circuit 601 and/or a spare logic region (e.g., spare logic regions 621D coupled to spare logic region 631D) of integrated circuit 603, but not to both, respectively.

For example, as shown in FIG. 6, as long as integrated circuit 602 has two spare logic regions (e.g., spare logic regions 621B and 621D), a first logic region portion (e.g., logic region 621A and spare logic region 621B) of integrated circuit 602 may shift in tandem with integrated circuit 601, and a second logic region portion (e.g., logic regions 621C and spare logic region 621D) of integrated circuit 602 may shift in tandem with integrated circuit 603. For example, the first logic region portion of integrated circuit 602 may shift in tandem with logic regions of integrated circuit 601 into use when a defect (e.g., defective logic region 611A) is detected in integrated circuit 601. In this scenario, there is no need for logic regions (e.g., logic region 631C and spare logic region 631D) from non-adjacent integrated circuit 603 to be shifted down in response to the defect in integrated circuit 601.

Figure 7:
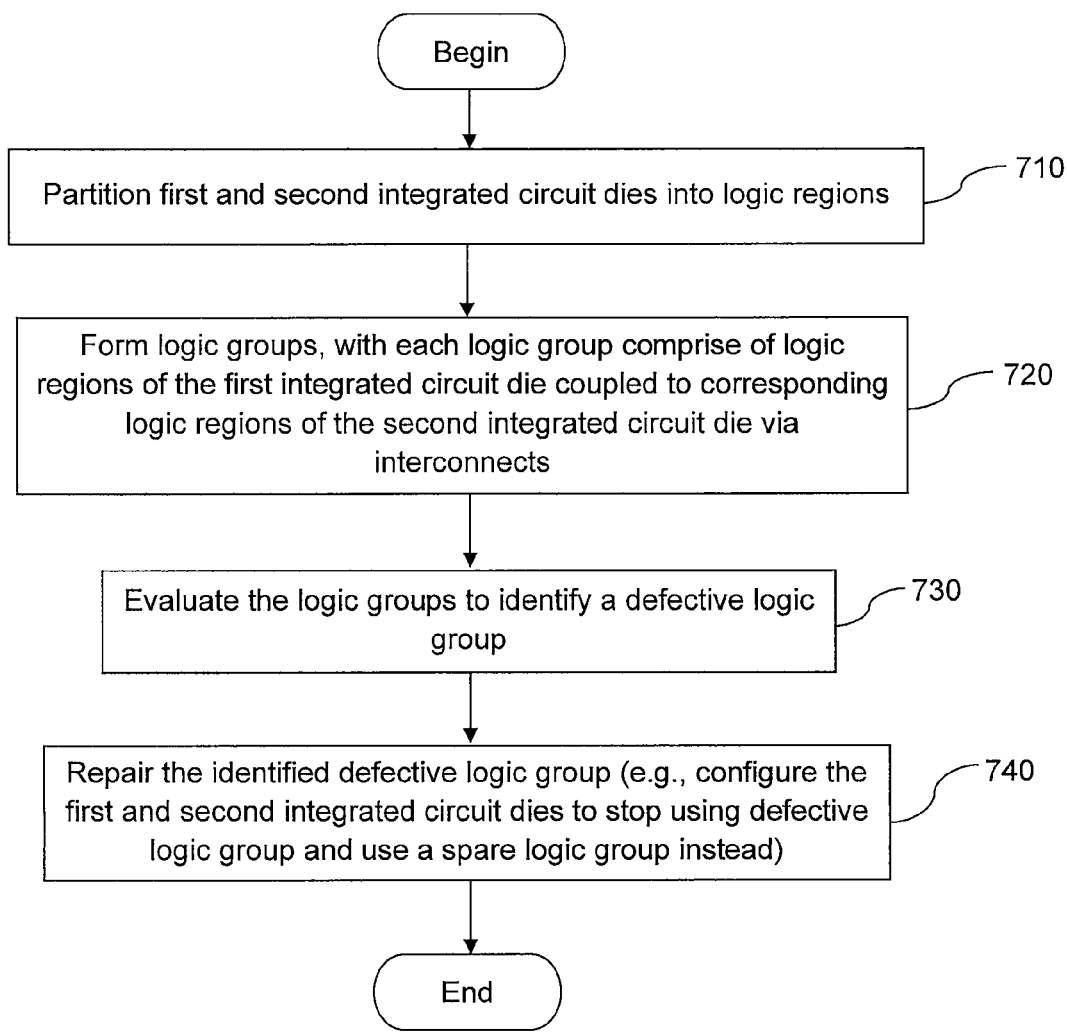
FIG. 7 is a flowchart of illustrative steps that may be performed to manufacture a multi-chip package in accordance with one embodiment of the present invention.

Illustrative steps involved that may be performed to manufacture a multi-chip package 400 of FIG. 4D in accordance with one embodiment of the present invention are shown in FIG. 7. At step 710, integrated circuit dies 420 and 421 are partitioned into logic regions. Each integrated circuit die has at least one spare logic region for the purpose of redundancy.

Initially, the integrated circuit dies may be tested for defects. Dedicated computing equipment that is sometimes referred to as a tester or test equipment (e.g., test equipment 101 of FIG. 2) may be used to control test operations. During testing operation, test equipment 101 may perform one or more electrical test on multi-chip package 400 to screen out defective integrated circuits. Identified defective integrated circuits are then grouped based on location of defects. Fully functional (non-defective) integrated circuits are grouped separately from the defective integrated circuit dies. During packaging, integrated circuits with matching defect location may be packaged together.

At step 720, logic groups are formed, with each logic group organized in an order. Each logic group comprise of logic regions of the first integrated circuit die coupled to corresponding logic regions of the second integrated circuit die via interconnects. With arrangement of FIG. 4A, for example, logic region 211A of integrated circuit 201, logic region 221A of integrated circuit 202 and interconnect 251A are grouped together and is collectively referred to as logic group 216.

After packaging, the multi-chip package may undergo post-packaging test to determine whether additional failures are introduced. At step 730, the logic groups are evaluated to identify a defective logic group. A logic group may be considered as a defective logic group if any one of its component logic regions or the interconnect between the component logic regions is defective.

At step 740, the identified defective logic group is repaired by configuring the first and second integrated circuit dies to stop using defective logic group. A spare logic group (e.g., spare logic group R4) may be activated into use to replace the defective logic group. Each successive logic group is substituted in the order following the defective logic group with a previous logic group. To repair this defect, all logic functions starting from defective logic group R2 are shifted down to the next successive logic group so that defective logic group R2 is not used.

Figure 8:
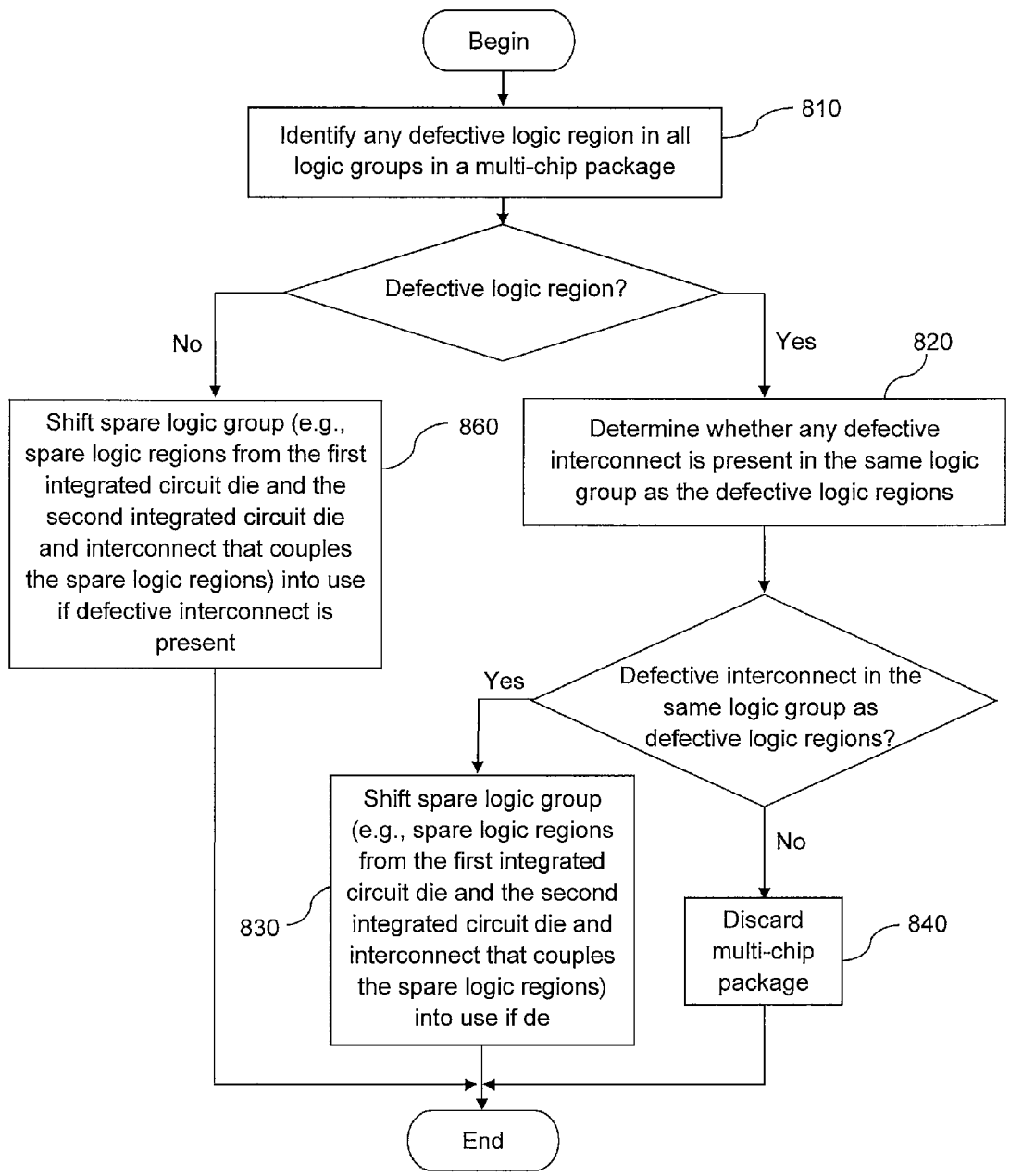
FIG. 8 is a flowchart of illustrative steps that may be performed to test a multi-chip package for defects in accordance with one embodiment of the present invention.

FIG. 8 is a flowchart of illustrative steps that may be performed to test a multi-chip package for defects with reference to steps 720 and 730 of FIG. 7 in accordance with one embodiment of the present invention. The multi-chip can be tested for defects using test equipment such as test equipment 76 of FIG. 2. Referring to step 720, groups of logic regions on the multi-chip package are evaluated to identify a defective logic group.

At step 810, defective logic regions may be identified in all logic groups in the multi-chip package. In response to identifying defective logic regions, the test equipment may further determine whether defective interconnects are present in the same logic group as the defective logic regions at step 820. In one embodiment, a logic group is considered as defective if any one of the logic region, corresponding logic region and interconnect in the logic group is defective. In this scenario, the defective logic group may be repaired by configuring the first and second integrated circuit dies to stop using the defective logic group and shift a spare logic group into use at step 830. Otherwise, the multi-chip package is discarded at step 840.

In the event that a defective interconnect is present when no defective logic regions are identified, the logic group that contains the defective interconnect and the functional logic regions that couples between the defective interconnect will be considered as defective. In this scenario, the spare logic group may also be shifted into use to repair the defective logic group at step 850.

The method and apparatus described herein may be incorporated into any suitable circuit. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method comprising:
    partitioning first and second integrated circuit dies into a plurality of logic regions, the first and second integrated circuit dies each including a spare logic region, wherein corresponding logic regions of the first and second integrated circuit dies are coupled using interconnects on a multi-chip package that includes the first and second integrated circuit dies;
    forming a plurality of logic groups, each logic group comprising a configurable logic region on the first integrated circuit die that performs a first user logic function and a corresponding configurable logic region on the second integrated circuit die that performs a second user logic function, wherein the logic regions of the logic group are coupled using the interconnects on the multi-chip package;
    evaluating the plurality of logic groups to identify a defective logic group; and
    in response to identifying the defective logic group, repairing the defective logic group by configuring the first and second integrated circuit dies to stop using the defective logic group and use a spare logic group comprising the spare logic regions of the first and second integrated circuit dies, wherein the spare logic regions are coupled using spare logic region interconnects on the multi-chip package.

2. The method defined in claim 1 wherein repairing the defective logic group comprises:
    substituting the logic regions of the defective logic group with the spare logic regions of the spare logic group.

3. The method defined in claim 1 wherein identifying the defective logic group comprises determining whether any one of the logic regions or interconnects of the defective logic group is defective.

4. The method defined in claim 1 wherein the logic groups are organized in an order, wherein repairing the defective logic group comprises:
    substituting each successive logic group in the order following the defective logic group with a previous logic group.

5. The method defined in claim 1 wherein the spare logic regions of the first and second integrated circuit dies are coupled by the spare logic region interconnects, the method further comprising:
    in response to identifying the defective logic group, configuring the multi-chip package to use the spare logic region interconnects instead of the interconnect from the defective logic group.

6. The method defined in claim 5 wherein the first and second integrated circuit die are mounted on an interposer, wherein the interconnect and the additional interconnect are formed at least partly in the interposer, and wherein configuring the integrated circuit package to use the spare logic regions of the first and second integrated circuit dies comprises:
    configuring the spare logic region of the first integrated circuit die to perform the first logic function; and
    configuring the spare logic region of the second integrated circuit die to perform the second logic function.

7. The method defined in claim 5 wherein the first integrated circuit die is mounted on the second integrated circuit die, wherein the interconnect and the additional interconnect include through-silicon vias in the first integrated circuit die, and wherein configuring the integrated circuit package to use the spare logic regions of the first and second integrated circuit dies comprises:

configuring the spare logic region of the first integrated circuit die to communicate with the spare logic region of the second integrated circuit die via the additional interconnect; and configuring another spare logic region from the second integrated circuit die to communicate with a spare logic region from a third integrated circuit die via another additional interconnect.

8. A method of manufacturing an integrated circuit package, the method comprising:

forming a plurality of logic groups from first and second logic circuitries, the first and second logic circuitries each including a plurality of logic regions and at least one spare logic region, wherein corresponding logic regions of the first and second logic circuitries are coupled using interconnects on the integrated circuit package that includes the first and second logic circuitries;

evaluating the plurality of logic groups to identify a defective logic group by determining whether any one of the logic regions of the defective logic group is defective; and in response to identifying the defective logic group, repairing the defective logic group by configuring the integrated circuit package to use a spare logic group instead of the defective logic group, wherein the spare logic group comprising spare logic regions of the first and second logic circuitries.

9. The method defined in claim 8, further comprising:
identifying defective logic region from the plurality of logic regions of the first and second logic circuitries.

10. The method defined in claim 9 further comprising:
grouping defective logic regions based on the location of the identified defective logic regions.

11. The method defined in claim 8 wherein repairing the defective logic group further comprising:

configuring the spare logic regions of the spare logic group using test equipment to replace the logic regions of the defective logic group.

12. The method defined in claim 11 wherein the spare logic regions are coupled using spare interconnects, wherein replacing the logic further comprising:

selecting the spare interconnects into use to replace the interconnect of the defective logic group.

13. The method defined in claim 8 wherein the logic groups are organized in an order, wherein repairing the defective logic group comprises:

replacing each successive logic group in the order following the defective logic group with a previous logic group.

14. A multi-chip package comprising:

a first integrated circuit having a first logic region and at least one spare logic region;

a second integrated circuit having a second logic region and at least one spare logic region, wherein the first and second integrated circuits include a different number of spare logic regions;

an interconnect coupled between the first logic region of the first integrated circuit and second logic region of the second integrated circuit; and an additional interconnect that is coupled between the spare logic regions of the first and second integrated circuits, wherein the spare logic regions and the additional interconnect are utilized in response to a defect.

15. The multi-chip package defined in claim 14 wherein the defect can be in any one of the first logic region, second logic region, and interconnect.

16. The multi-chip package defined in claim 14 further comprising:

first multiplexing circuitry that is configured to select the spare logic region of the first integrated circuit when the first logic region is defective.

17. The multi-chip package defined in claim 16 further comprising:

second multiplexing circuitry that is configured to select the spare logic region of the second integrated circuit when the second logic region is defective.

18. The multi-chip package defined in claim 17 wherein the first integrated circuit is mounted on the second integrated circuit, wherein the interconnect and the additional interconnect include through-silicon vias in the first integrated circuit.

19. A multi-chip package comprising:

a first integrated circuit having a first logic region and at least one spare logic region;

a second integrated circuit having a second logic region and at least one spare logic region;

an interconnect coupled between the first logic region of the first integrated circuit and second logic region of the second integrated circuit; and an additional interconnect that is coupled between the spare logic regions of the first and second integrated circuits, wherein the spare logic regions and the additional interconnect are utilized in response to a defect, wherein the first and second integrated circuits are mounted on an interposer, and wherein the first integrated circuit is placed adjacent to the second integrated circuit.

* * * * *